(12) United States Patent
Terwilliger et al.

(10) Patent No.: US 9,258,913 B2
(45) Date of Patent: Feb. 9, 2016

(54) MULTI-STAGE INFORMATION HANDLING RESOURCE RELEASE LATCH FOR USE IN A MODULAR INFORMATION HANDLING SYSTEM CHASSIS

(71) Applicant: Dell Products L.P., Round Rock, TX (US)

(72) Inventors: Kevin D. Terwilliger, Austin, TX (US); Richard Andrew Crisp, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 85 days.

(21) Appl. No.: 14/093,673

(22) Filed: Dec. 2, 2013

(65) Prior Publication Data

US 2015/0156902 A1   Jun. 4, 2015

(51) Int. Cl.
H05K 5/00 (2006.01)
H05K 5/02 (2006.01)
H05K 7/14 (2006.01)

(52) U.S. Cl.
CPC ............ *H05K 5/0221* (2013.01); *H05K 7/1487* (2013.01); *Y10T 403/59* (2015.01)

(58) Field of Classification Search
CPC ..... H05K 5/00; H05K 5/0021; H05K 5/0217; H05K 5/0221; H05K 7/14; H05K 7/1411
See application file for complete search history.

(56) References Cited

U.S. PATENT DOCUMENTS

| | | | | |
|---|---|---|---|---|
| 4,941,841 A * | 7/1990 | Darden et al. | ............ | 361/679.39 |
| 5,660,553 A * | 8/1997 | Larabell | ......................... | 439/160 |
| 6,058,579 A * | 5/2000 | Brocklesby et al. | ............ | 24/459 |
| 6,067,225 A * | 5/2000 | Reznikov et al. | ........ | 361/679.31 |
| 6,381,146 B1 * | 4/2002 | Sevier | .......................... | 361/754 |
| 6,515,855 B1 * | 2/2003 | Removedummy | ....... | 361/679.33 |
| 2009/0279249 A1 * | 11/2009 | Crippen et al. | .......... | 361/679.58 |
| 2011/0042985 A1 * | 2/2011 | Peng et al. | .................... | 294/86.4 |
| 2011/0101831 A1 * | 5/2011 | Wang et al. | ................ | 312/223.1 |
| 2013/0130528 A1 * | 5/2013 | Jun et al. | ....................... | 439/160 |
| 2013/0313955 A1 * | 11/2013 | Kuo | ............................... | 312/326 |
| 2014/0117829 A1 * | 5/2014 | Lin | ................................ | 312/350 |
| 2014/0126144 A1 * | 5/2014 | Kyle et al. | ................ | 361/679.58 |
| 2014/0204537 A1 * | 7/2014 | Rust | ............................... | 361/727 |
| 2015/0076982 A1 * | 3/2015 | Degay et al. | .................. | 312/333 |
| 2015/0092322 A1 * | 4/2015 | Yen | ............................ | 361/679.01 |

\* cited by examiner

*Primary Examiner* — Daniel Rohrhoff
(74) *Attorney, Agent, or Firm* — Jackson Walker L.L.P.

(57) ABSTRACT

In accordance with embodiments of the present disclosure, a multi-stage latch assembly for facilitating removal of a structural element from a chassis may include a lock and a latch. The lock may be configured to toggle between a locked state and an unlocked state. The latch may be configured to translate between a first position and a second position such that the latch is in the first position when the lock is in the locked state and the latch is in the second position when the lock is in the unlocked state.

21 Claims, 5 Drawing Sheets

MULTI-STAGE INFORMATION HANDLING RESOURCE RELEASE LATCH FOR USE IN A MODULAR INFORMATION HANDLING SYSTEM CHASSIS

TECHNICAL FIELD

The present disclosure relates to modular information handling systems. More specifically, embodiments of the disclosure provide systems and methods for removing information handling resources from a chassis configured to house multiple modular information handling resources.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Existing server architectures either provide a single monolithic server capable of running one operating system (or a single hypervisor running multiple virtualized operating systems) and input/output ("I/O") resources at a time, or bulky blade server chassis providing multiple servers and I/O control modules in a single chassis. A system chassis with multiple information handling systems with various peripheral and I/O capabilities common to the chassis as a whole may provide advantages, as it allows a blade server chassis in a small form factor, thereby providing a blade server chassis with a size comparable to the size of a monolithic server. Implementation of a system chassis with multiple information handling systems with various peripheral and I/O capabilities common to the chassis as a whole presents numerous challenges.

SUMMARY

In accordance with the teachings of the present disclosure, the disadvantages and problems associated with traditional approaches to accessing modular information handling resources in a chassis have been substantially reduced or eliminated.

In accordance with embodiments of the present disclosure, a multi-stage latch assembly for facilitating removal of a structural element from a chassis may include a lock and a latch. The lock may be configured to toggle between a locked state and an unlocked state. The latch may be configured to translate between a first position and a second position such that the latch is in the first position when the lock is in the locked state and the latch is in the second position when the lock is in the unlocked state.

In accordance with these and other embodiments of the present disclosure, a chassis drawer configured to carry one or more modular information handling resources may include one or more structural elements and a multi-stage latch assembly. The one or more structural elements may be configured to carry the one or more modular information handling systems and configured such that the chassis drawer may translate between an open position and a closed position relative to a chassis while the chassis drawer is disposed in the chassis. The multi-stage latch assembly may be coupled to at least one of the one or more structural elements, the multi-stage latch comprising a lock and a latch. The lock may be configured to toggle between a locked state and an unlocked state. The latch may be configured to translate between a first position and a second position such that the latch is in the first position when the lock is in the locked state and the latch is in the second position when the lock is in the unlocked state.

In accordance with these and other embodiments of the present disclosure, a method may include toggling a lock of a multi-stage latch assembly for facilitating removal of a structural element from a chassis between a locked state and an unlocked state responsive to user interaction with the lock. The method may also include translating a latch between a first position and a second position such that the latch is in the first position when the lock is in the locked state and the latch is in the second position when the lock is in the unlocked state.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1-6C, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more busses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

In this disclosure, the term "information handling resource" may broadly refer to any component system, device or apparatus of an information handling system, including without limitation processors, busses, memories, input-output devices and/or interfaces, storage resources, network interfaces, motherboards, electro-mechanical devices (e.g., fans), displays, and power supplies.

Figure 1:
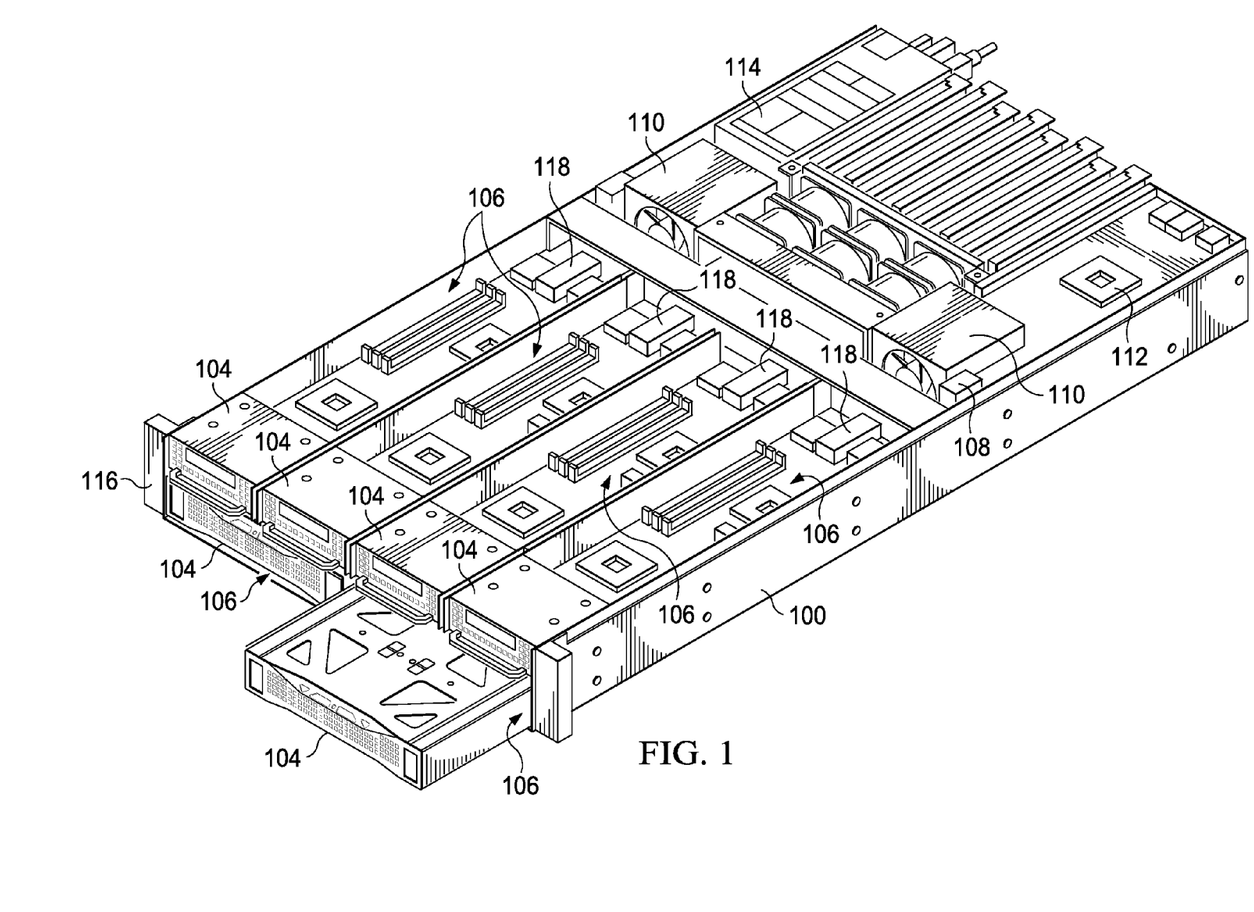
FIG. 1 illustrates a cut-away perspective view of a chassis for receiving modular information handling resources, in accordance with embodiments of the present disclosure.

FIG. 1 illustrates a perspective view of a chassis 100 for receiving modular information handling resources, in accordance with embodiments of the present disclosure, with certain elements (e.g., walls for enclosing components within chassis 100) cut-away or removed in order to show information handling resources internal to chassis 100. Chassis 100 may be an enclosure that serves as a container for various information handling systems and information handling resources, and may be constructed from steel, aluminum, plastic, and/or any other suitable material. Although the term "chassis" is used, chassis 100 may also be referred to as a case, cabinet, tower, box, enclosure, and/or housing. In certain embodiments, chassis 100 may be configured to hold and/or provide power to a plurality of information handling systems and/or information handling resources. As depicted in FIG. 1, chassis 100 may include one or more slots 106 configured to receive drawers 104 for carrying information handling resources, as described in greater detail below. For example, some drawers 104 may include one or more information handling systems. As another example, some drawers 104 may include one or more peripherals (e.g., hard disk drives, graphics processing units, etc.) associated with information handling systems disposed in another drawer 104.

Each drawer 104 may include an interface connector 118 configured to electrically couple to a midplane 108, thus providing electrical coupling between information handling resources carried on the various drawers 104 to each other and/or one or more networks or devices external to chassis 100. Midplane 108 may comprise any system, device, or apparatus configured to interconnect information handling resources of chassis 100 with each other. Accordingly, midplane 108 may include slots, pads, and/or other connectors configured to receive corresponding electrical connectors of information handling resources in order to electrically couple information handling systems disposed in drawers 104 and/or information handling resources to each other.

A chassis management controller (CMC) 112 may be communicatively coupled to midplane 108 and may comprise any system, device, or apparatus configured to facilitate management and/or control of components of chassis 100, information handling systems modularly coupled within, and/or one or more of its component information handling resources. CMC 112 may be configured to issue commands and/or other signals to manage and/or control information handling systems coupled to slots 106 and/or information handling resources of chassis 100. CMC 112 may comprise a microprocessor, microcontroller, DSP, ASIC, field programmable gate array ("FPGA"), EEPROM, or any combination thereof.

In addition or alternatively, CMC 112 may also provide a management console for user/administrator access to these functions. For example, CMC 112 may provide for communication with a user interface (e.g., user interface 116), permitting a user to interact with CMC 112 and configure control and management of components of chassis 100 by CMC 112. As another example, CMC 112 may implement Web Services Management ("WS-MAN") or another suitable management protocol permitting a user to remotely access a CMC 112 to configure chassis 100 and its various information handling resources. In such embodiments, a CMC 112 may interface with a network interface separate from a traditional network interface of chassis 100, thus allowing for "out-of-band" control of chassis 100, such that communications to and from CMC 112 are communicated via a management channel physically isolated from an "in band" communication channel with the traditional network interface. Thus, for example, if a failure occurs in chassis 100 that prevents an administrator from interfacing with chassis 100 via a traditional network interface and/or user interface 116 (e.g., operating system failure, power failure, etc.), the administrator may still be able to monitor and/or manage chassis 100 (e.g., to diagnose problems that may have caused failure) via CMC 112. In the same or alternative embodiments, CMC 112 may allow an administrator to remotely manage one or more parameters associated with operation of chassis 100 and its various information handling resources (e.g., power usage, processor allocation, memory allocation, security privileges, etc.).

One or more air movers 110 may be communicatively coupled to CMC 112, and may include any mechanical or electro-mechanical system, apparatus, or device operable to move air and/or other gasses. In some embodiments, an air mover 110 may comprise a fan (e.g., a rotating arrangement of vanes or blades which act on the air). In other embodiments, an air mover 110 may comprise a blower (e.g., a centrifugal fan that employs rotating impellers to accelerate air received at its intake and change the direction of the airflow). In these and other embodiments, rotating and other moving components of an air mover 110 may be driven by a motor. The rotational speed of such motor may be controlled by one or more control signals communicated from CMC 112. In operation, an air mover 110 may cool information handling systems and information handling resources of chassis 100 by drawing cool air into chassis 100 from outside chassis 100, expel warm air from inside chassis 100 to the outside of chassis 100, and/or move air across one or more heatsinks (not explicitly shown) internal to chassis 100 to cool one or more information handling systems and/or information handling resources. Although FIG. 1 depicts chassis 100 as having two air movers 110, chassis 100 may include any suitable number of air movers 110.

As shown in FIG. 1, chassis 100 may include one or more power supplies 114. Generally speaking, a power supply 114 may include any system, device, or apparatus configured to supply electrical current to one or more information handling resources within chassis 100.

A user interface 116 may include any system, apparatus, or device via which a user may interact with chassis 100 and its various components by facilitating input from a user allowing the user to manipulate chassis 100 and output to a user allowing chassis 100 to indicate effects of the user's manipulation. For example, user interface 116 may include a display suitable for creating graphic images and/or alphanumeric characters recognizable to a user, and may include, for example, a liquid crystal display, a cathode ray tube, a plasma screen, and/or a digital light processor projection monitor. In certain embodiments, such a display may be an integral part of chassis 100 and receive power from one or more power supplies 114 of chassis 100, rather than being coupled to chassis 100 via a cable. In some embodiments, such display may comprise a touch screen device capable of receiving user input, wherein a touch sensor may be mechanically coupled or overlaid upon the display and may comprise any system, apparatus, or device suitable for detecting the presence and/or location of a tactile touch, including, for example, a resistive sensor, capacitive sensor, surface acoustic wave sensor, projected capacitance sensor, infrared sensor, strain gauge sensor, optical imaging sensor, dispersive signal technology sensor, and/or acoustic pulse recognition sensor. In these and other embodiments, user interface 116 may include other user interface elements (e.g., a keypad, buttons, and/or switches placed in proximity to a display) allowing a user to provide input to chassis 100. In these and other embodiments, user interface 116 may include one or more visual indicators, such as light-emitting diodes, for example, for communicating information to a user. User interface 116 may be coupled to CMC 112 and/or other components of chassis 100, and thus may allow a user to configure various information handling systems and/or information handling resources of chassis 100.

Figure 2:
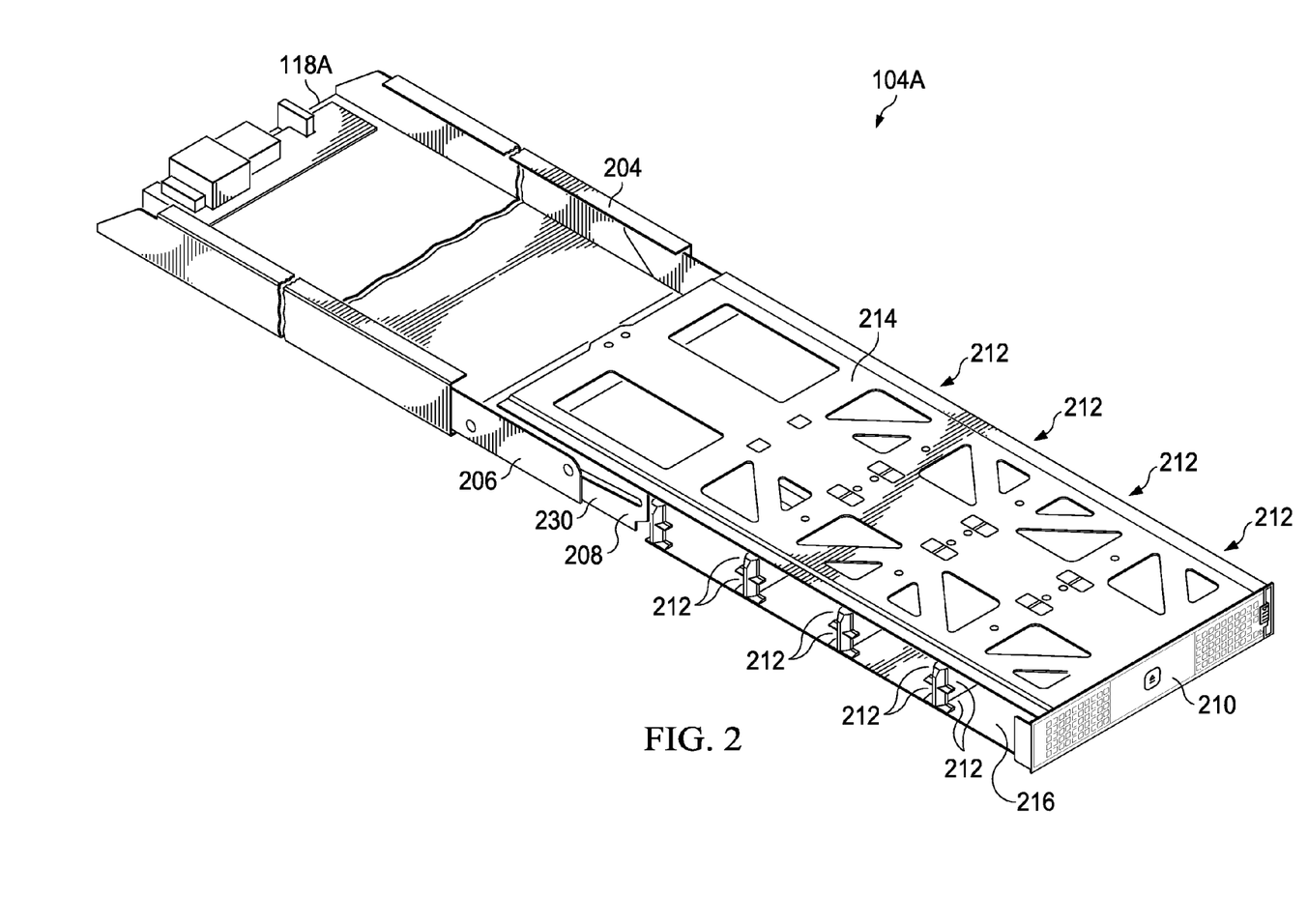
FIG. 2 illustrates a perspective view of an example chassis drawer for carrying modular information handling resources, the drawer in an open position, in accordance with embodiments of the present disclosure.
Figure 3:
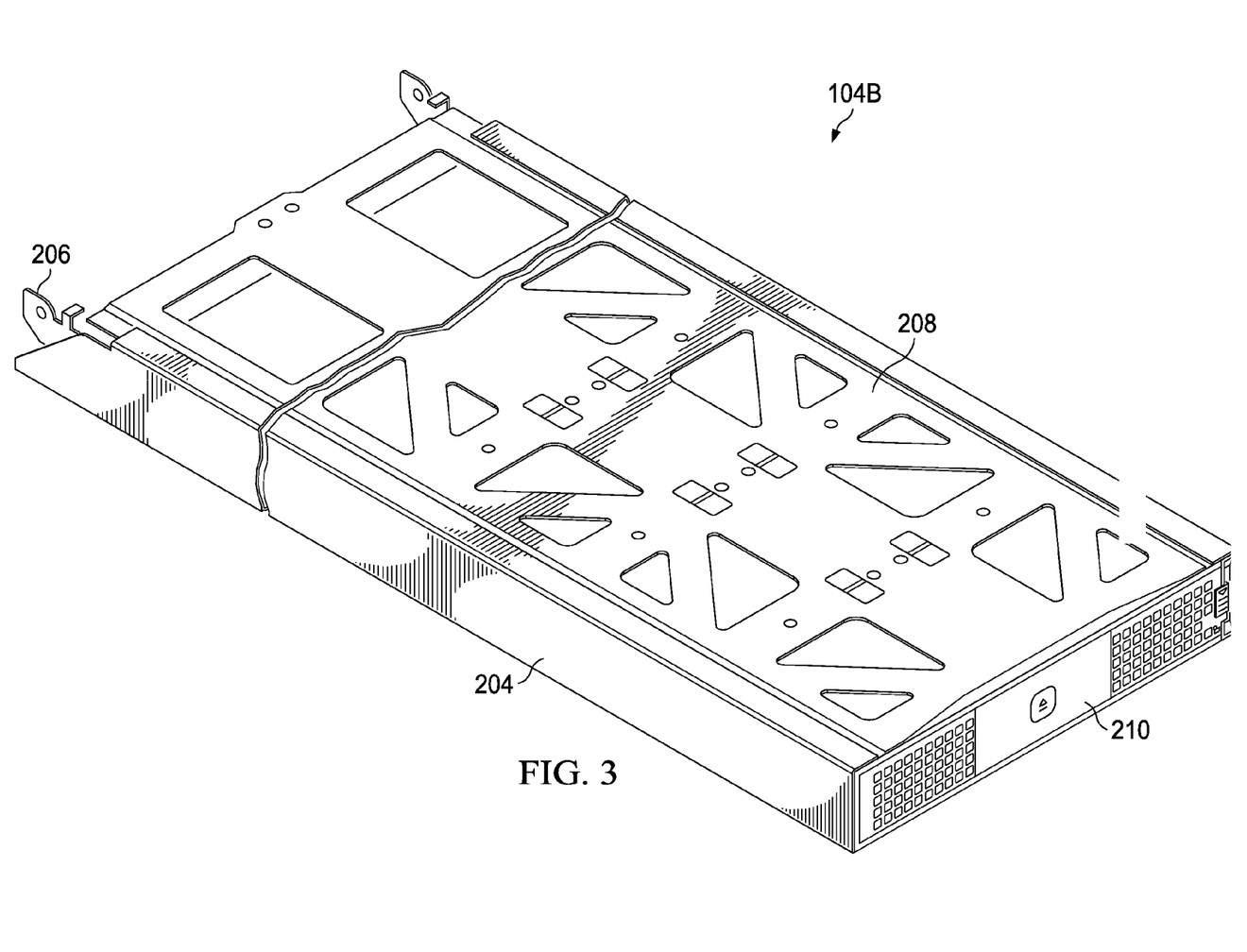
FIG. 3 illustrates a perspective view of an example chassis drawer for carrying modular information handling resources, the drawer in a closed position, in accordance with embodiments of the present disclosure.

FIGS. 2 and 3 depict various views of an example chassis drawer 104A for carrying modular information handling resources, in accordance with embodiments of the present disclosure. FIG. 2 illustrates a perspective view of an example chassis drawer 104A for carrying modular information handling resources, wherein drawer 104A is in an open position drawn from chassis 100, in accordance with embodiments of the present disclosure. FIG. 3 illustrates a perspective view of chassis drawer 104A for carrying modular information handling resources, wherein drawer 104A is in a closed position relative to chassis 100, in accordance with embodiments of the present disclosure.

As shown in FIGS. 2 and 3, chassis drawer 104A may comprise an inner member 204, an intermediate member 206 mechanically coupled to inner member 204, and a carrier member 208 mechanically coupled to intermediate member 206. Inner member 204 may be constructed from steel, aluminum, plastic, and/or any other suitable material. Although inner member 204 may have any suitable size and/or shape, inner member 204 is depicted in the embodiments of FIGS. 2 and 3 as having two substantially planar and parallel opposite sides defining a drawer height coupled to each other by a substantially planar bottom generally perpendicular to the sides defining a drawer width and a guide flange extending from and running perpendicular to and along the length of each side such that the flanges project towards each other. In some embodiments, inner member 204 may be mechanically coupled to the internal mechanical structure of chassis 100, such that inner member 204 is fixed relative to chassis 100.

Intermediate member 206 may be constructed from steel, aluminum, plastic, and/or any other suitable material. Although intermediate member 206 may have any suitable size and/or shape, intermediate member 206 is depicted in the embodiments of FIGS. 2 and 3 as having two generally parallel and planar opposite sides coupled to each other by a substantially planar bottom generally perpendicular to the sides. The height of the sides and the width of the bottom may be such that the corresponding sides and bottom of inner member 204 provide a mechanical guide for intermediate member 206 as chassis drawer 104A is opened and closed. Intermediate member 206 may be mechanically coupled to inner member 204 via bearings and/or other mechanical components such that intermediate member 206 may slide relative to inner member 204 in a direction perpendicular to the drawer height and drawer width defined by inner member 204. In some embodiments, intermediate member 206 may be limited in the distance it may be drawn from chassis 100 through any combination of suitable structural elements. Similarly, in some embodiments, other mechanical components may restrict motion of intermediate member 206 relative to inner member 204 as chassis drawer 104A is translated from the open position to the closed position.

Carrier member 208 may be constructed from steel, aluminum, plastic, and/or any other suitable material. Although carrier member 208 may have any suitable size and/or shape, carrier member 208 is depicted in the embodiments of FIGS. 2 and 3 as having a substantially planar top 214 and a substantially planar bottom 216 generally parallel to each other defining a width and depth of carrier member 208, the top 214 and bottom 216 mechanically coupled to each other by one or more structural elements defining a height of carrier member 208, such that top 214 and bottom 216 are generally perpendicular to the sides of intermediate member 206. Carrier member 208 may also include a face 210 mechanically affixed to top 214 and/or bottom 216. As shown in FIGS. 2 and 3, top 214 may include one or more openings (e.g., above bays 212) allowing for gaseous fluid to pass through. Similarly, bottom 216 may also include one or more openings (e.g., below bays 212) allowing for gaseous fluid to pass through.

In some embodiments, face 210 may be substantially equal in width to the width of carrier member 208 and substantially equal to the height of carrier member 208. In these and other embodiments, face 210 may include handles, pull tabs, and/or other features allowing a person to pull on face 210 in order to translate chassis drawer 104A from a closed position to an open position in a direction generally parallel to the depth of top 214 and bottom 216. In these and other embodiments, face 210 may include a grill, vent, and/or other opening allowing gaseous fluid to enter and/or exit through face 210.

As shown in FIG. 2, each side of carrier member 208 (e.g., portions of carrier member 208 between the edges of and substantially parallel to top 214 and bottom 216) may include a web 230 configured to mechanically couple carrier member 208 to intermediate member 206, as well as openings for a plurality of bays 212.

Each of the various bays 212 defined by drawer 104A may include one or more electrical components for coupling an information handling resource (e.g., a hard disk drive) inserted into such bay 212 to other information handling resources of chassis 100. For example, a backplane (not explicitly shown) may couple a modular information handling resource disposed in a bay 212 to interface connector 118A, which, as described above, may in turn be coupled to midplane 108. In some embodiments, the various information handling resources may be coupled to interface connector 118A such that when chassis drawer 104A is drawn open relative to chassis 100, such information handling resources maintain electrical conductivity to interface connector 118A and interface connector 118A may maintain electrical conductivity to midplane 108, thus permitting insertion or removal of an information handling resource without affecting operation of other information handling resources carried by chassis drawer 104A. In such embodiments, interface connector 118A may only be decoupled from midplane 108 when the entirety of chassis drawer 104A is removed from chassis 100.

Figure 4:
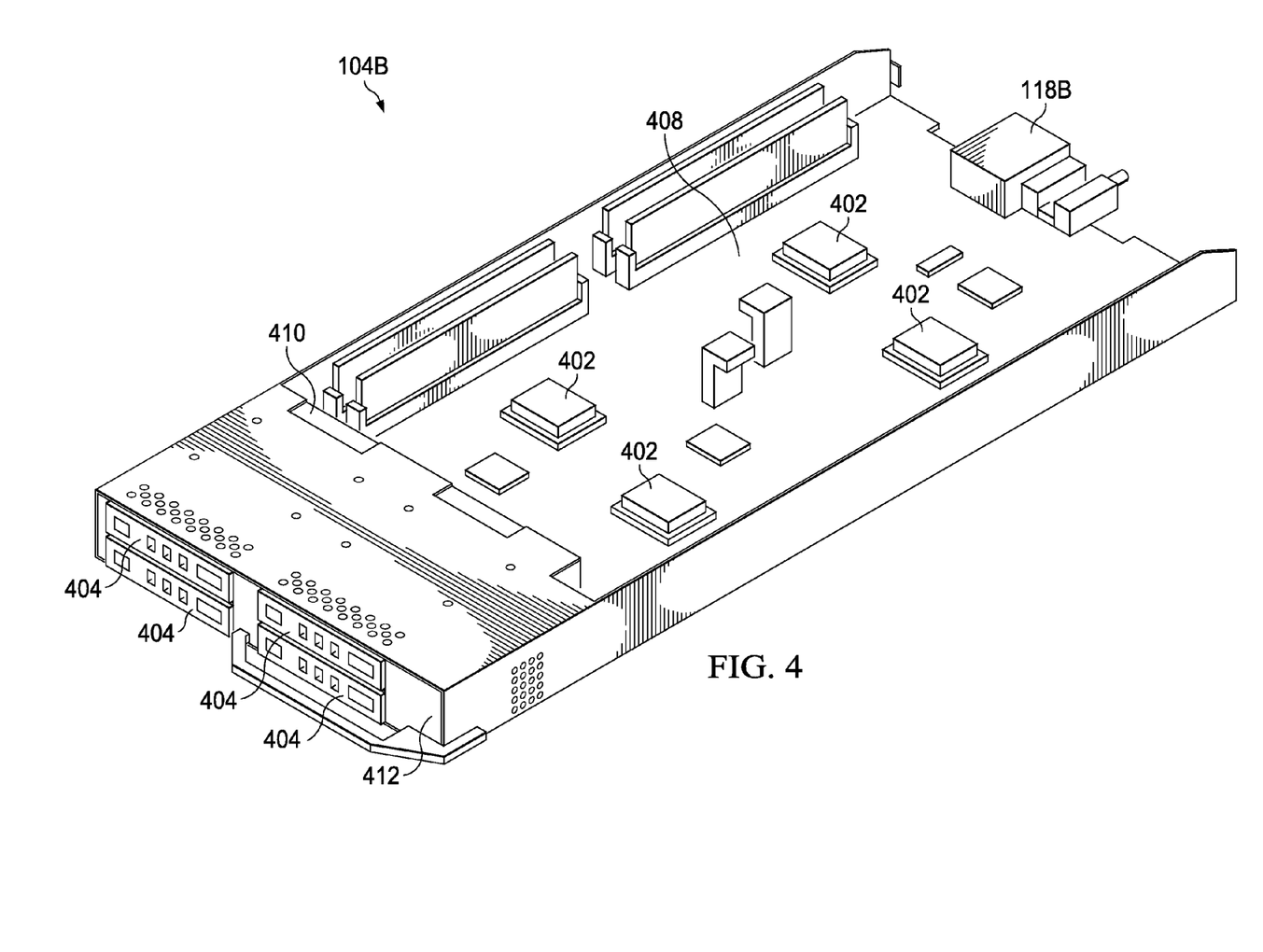
FIG. 4 illustrates a perspective view of another example chassis drawer for carrying information handling resources, in accordance with embodiments of the present disclosure.

FIG. 4 illustrates a perspective view of another example chassis drawer 104B for carrying information handling resources, in accordance with embodiments of the present disclosure. Although not labeled in detail as in FIGS. 2 and 3, chassis drawer 104B may include one or more mechanical and/or structural elements (e.g., similar or identical to inner member 204, intermediate member 206, and carrier member 208) for translating chassis drawer 104B between open and closed positions relative to chassis 100. Similar to chassis drawer 104A, the various information handling resources carried by chassis drawer 104B may be coupled to interface connector 118B such that when chassis drawer 104B is drawn open relative to chassis 100, such information handling resources maintain electrical conductivity to interface connector 118B and interface connector 118B may maintain electrical conductivity to midplane 108, thus permitting insertion or removal of an information handling resource without affecting operation of other information handling resources carried by chassis drawer 104B. In such embodiments, interface connector 118B may only be decoupled from midplane 108 when the entirety of chassis drawer 104B is removed from chassis 100.

In the particular chassis drawer 104B depicted in FIG. 4, a backplane 408 may have thereon a plurality (e.g., four) of processors 402 and a chipset associated with each processor 402, thus defining four independent information handling systems carried by chassis drawer 104B. Interface connector 118B may also be coupled to backplane 408, thus coupling processors 402 to information handling resources of chassis 100 external to chassis drawer 104B. In addition, the particular chassis drawer 104B depicted in FIG. 4 may include a plurality (e.g., four) of hard disk drives 404 communicatively coupled to backplane 408 (and thus one or more of processors 402) via a drive backplane 410.

As shown in FIG. 4, chassis drawer 104B may comprise a user interface 412. User interface 412 may include any system, apparatus, or device via which a user may interact with compute nodes (e.g., via a remote access controller such as an Integrated Dell Remote Access Controller of "iDRAC" for example) of chassis drawer 104B and its various components by facilitating input from a user allowing the user to compute nodes and to indicate effects of the user's manipulation. For example, user interface 412 may include a display suitable for creating graphic images and/or alphanumeric characters recognizable to a user, and may include, for example, a liquid crystal display, a cathode ray tube, a plasma screen, and/or a digital light processor projection monitor. In some embodiments, such display may comprise a touch screen device capable of receiving user input, wherein a touch sensor may be mechanically coupled or overlaid upon the display and may comprise any system, apparatus, or device suitable for detecting the presence and/or location of a tactile touch, including, for example, a resistive sensor, capacitive sensor, surface acoustic wave sensor, projected capacitance sensor, infrared sensor, strain gauge sensor, optical imaging sensor, dispersive signal technology sensor, and/or acoustic pulse recognition sensor. In these and other embodiments, user interface 412 may include other user interface elements (e.g., a keypad, buttons, and/or switches placed in proximity to a display) allowing a user to provide input to one or more compute nodes of chassis drawer 104B. In these and other embodiments, user interface 412 may include one or more visual indicators, such as light-emitting diodes, for example, for communicating information to a user.

Although FIGS. 2-4 depict particular example chassis drawers 104, chassis drawers 104 with other configurations may be employed consistent with the systems and methods herein disclosed. For example, in some embodiments, a chassis drawer 104 similar to that of chassis drawer 104B may include only one processor, such that the chassis drawer includes one compute node.

As mentioned above, components of chassis drawers 104 may remain powered on and operation while a chassis drawer is drawn open with respect to chassis 100, but when a chassis drawer 104 is removed entirely from a slot 106, a interface connector 118 of the chassis drawer may become uncoupled from midplane 108, thus causing loss of electrical power to components of the chassis drawer 104, and potential data loss. Because of the potential of data loss, it may be desirable that a process for removal of a chassis drawer 104 from a slot 106 ensures that such withdrawal is highly deliberate by the user.

Figure 5:
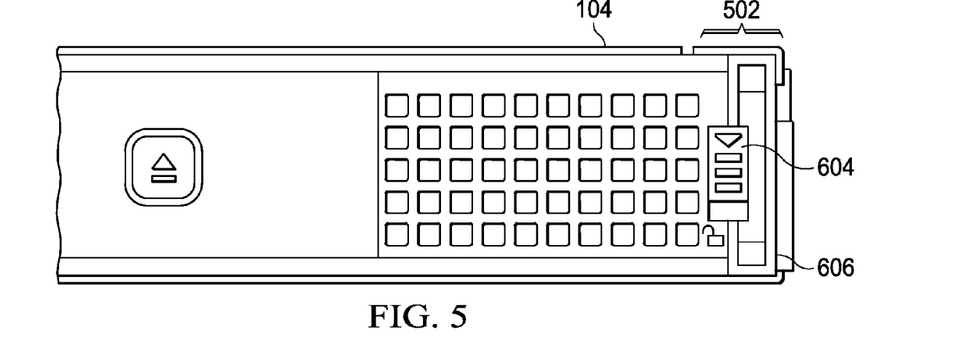
FIG. 5 illustrates a plan view of a chassis drawer including a multi-stage latch assembly, in accordance with embodiments of the present disclosure.
Figure 6A:
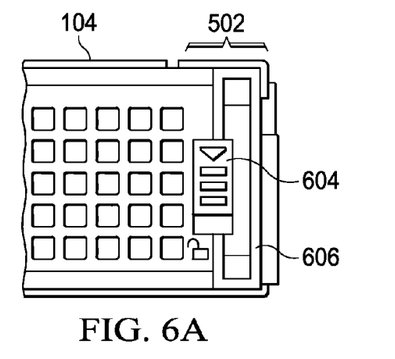
FIGS. 6A-6C illustrate close-up views of the latch assembly shown in FIG. 5 detailing various stages of user engagement with the latch in order to remove a chassis drawer from a chassis, in accordance with embodiments of the present disclosure.
Figure 6B:
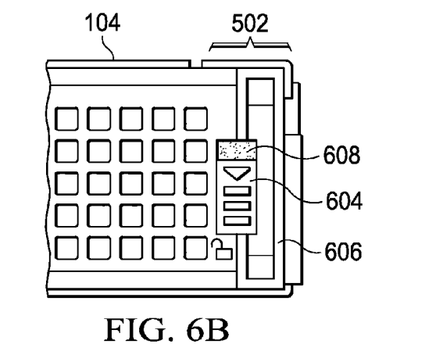
Figure 6C:
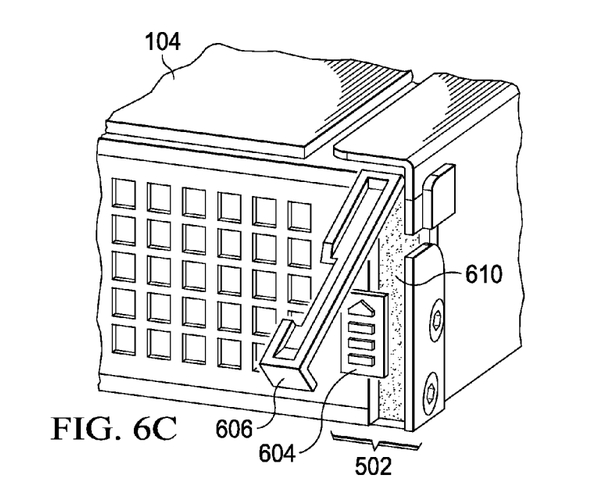

FIG. 5 illustrates a plan view of a chassis drawer 104 including a multi-stage latch assembly 502, in accordance with embodiments of the present disclosure. FIGS. 6A-6C illustrate close-up views of multi-stage latch assembly 502 detailing various stages of user engagement with latch assembly 502 in order to remove chassis drawer 104 from chassis 100, in accordance with embodiments of the present disclosure. FIG. 6A depicts latch assembly 502 in a state in which chassis drawer 104 is disposed in a slot 106 of chassis 100 and latch assembly 502 is locked. Such state may exist after chassis drawer 104 is fully engaged with a slot 106 (e.g., such that an interface connector 118 couples to midplane 108) until such time as a user engages with latch assembly 502 to remove chassis drawer 104 from chassis 100.

To begin the process of removal, a user may first toggle a lock 604 from a locked state to an unlocked state. For example, in embodiments represented by FIGS. 6A-6C, a user may toggle lock 604 from the locked state to the unlocked state by sliding an element of latch assembly 502 from one position to another, as is shown in the difference between FIG. 6A and FIG. 6B. In other embodiments, toggling may involve pushing of a button or some other tactile interaction by a user with latch assembly 502. In some embodiments, the toggling of lock 604 from the locked state to the unlocked state may reveal a warning indicator 608. Such warning indicator 608 may include any suitable indicator for providing a visual indication to a user that the user has unlocked latch assembly 502. For example, in some embodiments, toggling of lock 604 may reveal a portion of latch assembly 502 of different color (e.g., red, yellow, orange) than other portions of latch assembly 502 (e.g., black). Accordingly, such visual indicator 608 may serve as a warning to a user that completion of removal of chassis drawer 104 from chassis 100 may result in undesired data loss.

In addition, in some embodiments a latch 606 of latch assembly 502 may be mechanically coupled to lock 604 such that toggling of lock 604 from the locked state to the unlocked state may cause latch 606 to pivot or otherwise translate relative to chassis drawer 104 from a locked position (e.g., substantially flush a face of chassis drawer 104) to an unlocked position enabling the user to handle (e.g., grab) latch 606 in order to remove chassis drawer 104 from chassis 100. Similarly, in such embodiments, toggling from the unlocked state to the locked state of lock 604 may cause latch 606 to return to the position it maintained while lock 604 was in the locked state. Thus, latch 606 in the unlocked state of lock 604 may be more accessible to a user than latch 606 in the locked state.

Once lock 604 is in the locked state, a user may further translate (e.g., pivot or rotate) latch 606 as shown in FIG. 6C and apply force to disengage (e.g., slide) chassis drawer 104 from chassis 100. In some embodiments, the user's interaction with latch 606 may cause a spring-loaded component of chassis drawer 104 and/or chassis 100 to apply at least a portion of the force needed to eject chassis drawer 104 from chassis 100. In these and other embodiments, as a user translates latch 606 to remove chassis drawer 104 from chassis 100, latch assembly 502 may reveal a visual indicator 610. Such visual indicator may be similar to or different from visual indicator 608 descried above. Similarly, such visual indicator 610 may serve as a warning to a user that completion of removal of chassis drawer 104 from chassis 100 may result in undesired data loss.

In some embodiments, latch 606 may be spring-loaded such that when a user is not engaging latch 606, latch 606 translates back to the position shown in FIG. 6B that it maintains after lock 604 is toggled from the locked state to the unlocked state.

Although the present disclosure has been described in detail, it should be understood that various changes, substitutions, and alterations can be made hereto without departing from the spirit and the scope of the disclosure as defined by the appended claims.

What is claimed is:

1. A multi-stage latch assembly for facilitating removal of a structural element from a chassis, comprising:
   a lock configured to toggle between a locked state and an unlocked state;
   a latch configured to translate between a first position and a second position such that the latch is in the first position when the lock is in the locked state and the latch is in the second position when the lock is in the unlocked state; and
   an indicator other than the lock itself or a portion thereof and other than the latch itself or a portion thereof configured to provide a user-visible indication that the lock is in the unlocked state.

2. The multi-stage latch assembly of claim 1, wherein the latch is configured to translate from the second position to a third position in response to force applied to the latch by a user and configured to translate from the third position to the second position in response to withdrawal of force by the user to the latch.

3. The multi-stage latch assembly of claim 2, further comprising an indicator other than the latch itself configured to provide a user-visible indication that the latch has been translated from the second position.

4. The multi-stage latch assembly of claim 3, wherein the user-visible indication other than the latch itself comprises a user-visible indication other than mechanical components for translating the latch, mechanical components for maintaining the latch in the first position, and mechanical components for maintaining the latch in the second position.

5. The multi-stage latch assembly of claim 1, wherein the latch is substantially flush with a surface of the structural element in the first position and is substantially non-flush with the surface in the second position such that the latch in the second position is more accessible to a user than the latch in the first position.

6. The multi-stage latch assembly of claim 1, wherein the structural element is a drawer configured to carry one or more information handling resources.

7. The multi-stage latch assembly of claim 1, wherein the user-visible indication other than the lock itself comprises a user-visible indication other than mechanical components for translating the lock, mechanical components for maintaining the lock in the locked state, mechanical components for maintaining the lock in the unlocked state, mechanical components for translating the latch, mechanical components for maintaining the latch in the first position, and mechanical components for maintaining the latch in the second position.

8. A chassis drawer configured to carry one or more modular information handling resources, the chassis drawer comprising:
   one or more structural elements for carrying the one or more modular information handling systems and configured such that the chassis drawer may translate between an open position and a closed position relative to a chassis while the chassis drawer is disposed in the chassis; and
   a multi-stage latch assembly coupled to at least one of the one or more structural elements, the multi-stage latch assembly comprising:
      a lock configured to toggle between a locked state and an unlocked state;
      a latch configured to translate between a first position and a second position such that the latch is in the first position when the lock is in the locked state and the latch is in the second position when the lock is in the unlocked state; and
      an indicator other than the lock itself or a portion thereof and other than the latch itself or a portion thereof configured to provide a user-visible indication that the lock is in the unlocked state.

9. The chassis drawer of claim 8, wherein the latch is configured to translate from the second position to a third position in response to force applied to the latch by a user and configured to translate from the third position to the second position in response to withdrawal of force by the user to the latch.

10. The chassis drawer of claim 9, the multi-stage latch assembly further comprising an indicator other than the latch itself configured to provide a user-visible indication that the latch has been translated from the second position.

11. The chassis drawer of claim 10, wherein the user-visible indication other than the latch itself comprises a user-visible indication other than mechanical components for translating the latch, mechanical components for maintaining the latch in the first position, and mechanical components for maintaining the latch in the second position.

12. The chassis drawer of claim 8, wherein the latch is substantially flush with a surface of the chassis drawer in the first position and is substantially non-flush with the surface in the second position such that the latch in the second position is more accessible to a user than the latch in the first position.

13. The chassis drawer of claim 8, wherein the user-visible indication other than the lock itself comprises a user-visible indication other than mechanical components for translating the lock, mechanical components for maintaining the lock in the locked state, mechanical components for maintaining the lock in the unlocked state, mechanical components for translating the latch, mechanical components for maintaining the latch in the first position, and mechanical components for maintaining the latch in the second position.

14. A method comprising:
  toggling a lock of a multi-stage latch assembly for facilitating removal of a structural element from a chassis between a locked state and an unlocked state responsive to user interaction with the lock;
  translating a latch between a first position and a second position such that the latch is in the first position when the lock is in the locked state and the latch is in the second position when the lock is in the unlocked state; and
  displaying a user-visible indication other than the latch itself or a portion thereof and other than the lock itself or a portion thereof that that the latch has been translated from the second position.

15. The method of claim 14, further comprising, translating the latch from the second position to a third position in response to force applied to the latch by the a and configured to translate from the third position to the second position in response to withdrawal of force by the user to the latch.

16. The method of claim 15, further comprising displaying a user-visible indication other than the latch itself that the latch has been translated from the second position.

17. The method of claim 14, wherein the latch is substantially flush with a surface of the structural element in the first position and is substantially non-flush with the surface in the second position such that the latch in the second position is more accessible to a user than the latch in the first position.

18. The method of claim 14, further comprising displaying a user-visible indication other than the lock itself that the lock is in the unlocked state responsive to the lock toggling from the locked state to the unlocked state.

19. The method of claim 18, wherein the user-visible indication other than the lock itself comprises a user-visible indication other than mechanical components for translating the lock, mechanical components for maintaining the lock in the locked state, mechanical components for maintaining the lock in the unlocked state, mechanical components for translating the latch, mechanical components for maintaining the latch in the first position, and mechanical components for maintaining the latch in the second position.

20. The method of claim 14, wherein the structural element is a drawer configured to carry one or more information handling resources.

21. The method of claim 14, wherein the user-visible indication other than the latch itself comprises a user-visible indication other than mechanical components for translating the latch, mechanical components for maintaining the latch in the first position, and mechanical components for maintaining the latch in the second position.

* * * * *

UNITED STATES PATENT AND TRADEMARK OFFICE
CERTIFICATE OF CORRECTION

Page 1 of 1

PATENT NO. : 9,258,913 B2
APPLICATION NO. : 14/093673
DATED : February 9, 2016
INVENTOR(S) : Kevin D. Terwilliger et al.

It is certified that error appears in the above-identified patent and that said Letters Patent is hereby corrected as shown below:

In the Claims

Please amend Claim 15 as follows:

15. The method of Claim 14, further comprising, translating the latch from the second position to a third position in response to force applied to the latch by a user and configured to translate from the third position to the second position in response to withdrawal of force by the user to the latch.

Signed and Sealed this
Third Day of May, 2016

Michelle K. Lee
*Director of the United States Patent and Trademark Office*